(12) United States Patent
Fan et al.

(10) Patent No.: US 12,355,362 B2
(45) Date of Patent: Jul. 8, 2025

(54) INVERTER ASSEMBLY

(71) Applicant: Delta Electronics, Inc., Taoyuan (TW)

(72) Inventors: Kang-Yu Fan, Taoyuan (TW);
Jhih-Yang Li, Taoyuan (TW);
Hsing-Yu Wu, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 229 days.

(21) Appl. No.: 18/212,631

(22) Filed: Jun. 21, 2023

(65) Prior Publication Data

US 2024/0339935 A1    Oct. 10, 2024

(30) Foreign Application Priority Data

Apr. 6, 2023    (CN) .......................... 202310356808.2

(51) Int. Cl.
*H02M 7/00* (2006.01)
*H02M 7/58* (2006.01)

(52) U.S. Cl.
CPC ............ *H02M 7/003* (2013.01); *H02M 7/58* (2013.01)

(58) Field of Classification Search
CPC ...... H02M 7/003; H02M 7/58; H01R 4/4863; H01R 13/2421; H01R 25/162
See application file for complete search history.

(56) References Cited

U.S. PATENT DOCUMENTS

| | | | |
|---|---|---|---|
| 4,920,475 A | 4/1990 | Rippel | |
| 8,169,780 B2 | 5/2012 | Yoshino et al. | |
| 10,411,387 B2 | 9/2019 | Nishida et al. | |
| 2004/0228094 A1 | 11/2004 | Ahmed et al. | |
| 2005/0041055 A1* | 2/2005 | Silverbrook | ........... B41J 2/1623 348/E5.055 |
| 2005/0118744 A1* | 6/2005 | Ishiguro | ............. H01R 13/2421 438/66 |
| 2015/0188249 A1 | 7/2015 | Pereira | |
| 2017/0301600 A1 | 10/2017 | Frank et al. | |

(Continued)

FOREIGN PATENT DOCUMENTS

| | | |
|---|---|---|
| CN | 101859958 B | 10/2013 |
| CN | 109889058 A | 6/2019 |

(Continued)

*Primary Examiner* — Adolf D Berhane
*Assistant Examiner* — Afework S Demisse
(74) *Attorney, Agent, or Firm* — KIRTON McCONKIE; Evan R. Witt

(57) ABSTRACT

An inverter assembly is disclosed and includes a base, a contact terminal, an output copper busbar and an elastic component. The output copper busbar is disposed on the base. The output copper busbar includes an output portion configured to electrically connect with the contact terminal. The elastic component is disposed on the base and includes an abutting element, an elastic element and an accommodation seat. The accommodation seat is disposed on the base, the abutting element is connected to the accommodation seat through the elastic element along an axial direction. When the base is docked with the contact terminal, the abutting element of the elastic component abuts against the output portion to attach to the contact terminal, and the contact terminal abuts against the abutting element and the elastic element, so that a restoring force provided by the elastic element keeps the output portion abutting against the contact terminal.

18 Claims, 11 Drawing Sheets

(56) References Cited

U.S. PATENT DOCUMENTS

| | | |
|---|---|---|
| 2018/0337108 A1 | 11/2018 | Walter |
| 2020/0352041 A1 | 11/2020 | Bulovic et al. |
| 2022/0200467 A1 | 6/2022 | Andris et al. |

FOREIGN PATENT DOCUMENTS

| | | |
|---|---|---|
| CN | 108475869 B | 1/2020 |
| CN | 111448749 A | 7/2020 |
| CN | 113241956 A | 8/2021 |
| CN | 218477417 U | 2/2023 |
| DE | 102008034663 A1 | 2/2009 |
| DE | 102021202552 A1 | 9/2022 |
| TW | I445292 B | 7/2014 |
| TW | I513167 B | 12/2015 |
| TW | 202131617 A | 8/2021 |

\* cited by examiner

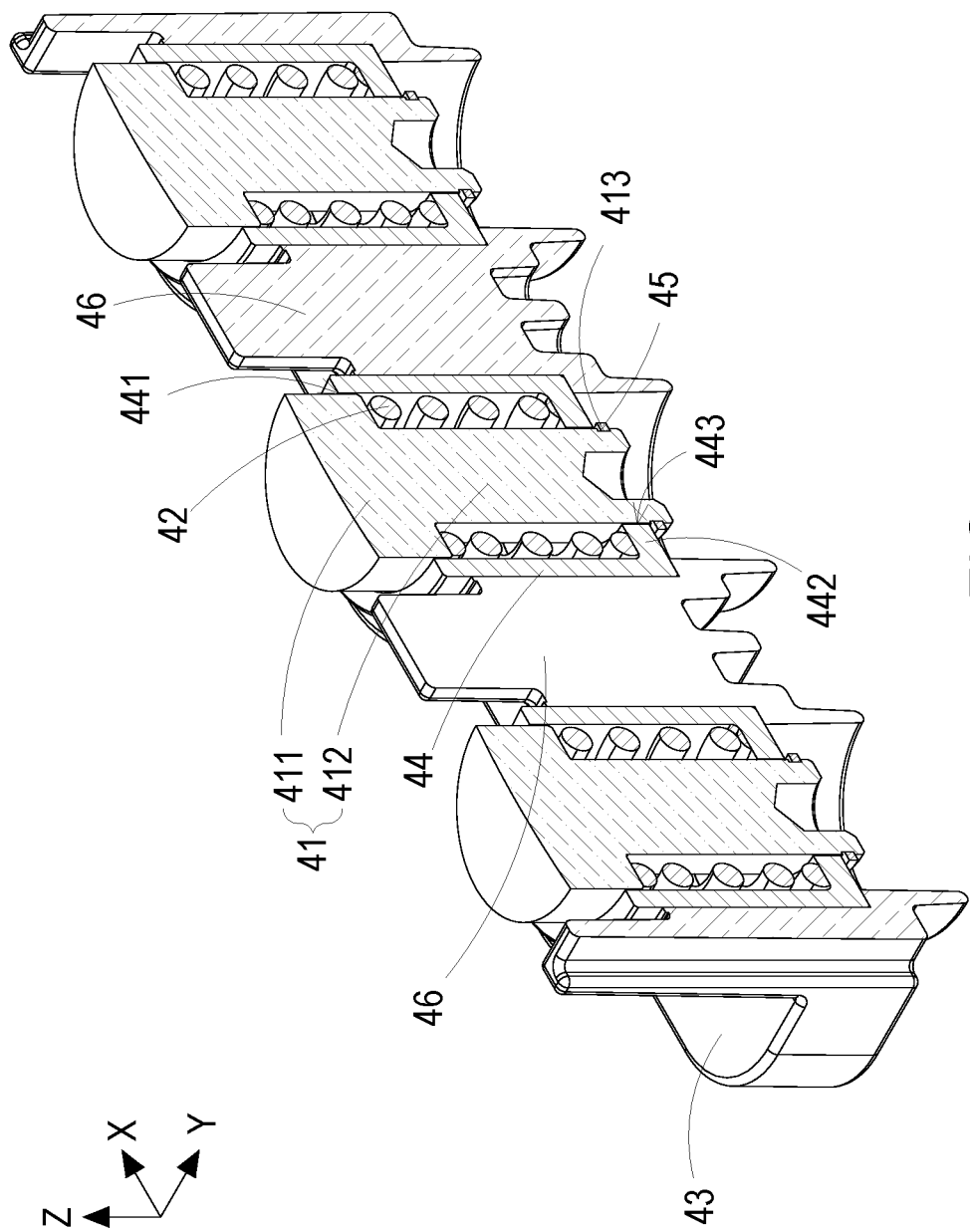

INVERTER ASSEMBLY

CROSS-REFERENCE TO RELATED APPLICATION

This application claims priority to China Patent Application No. 202310356808.2, filed on Apr. 6, 2023. The entire contents of the above-mentioned patent application are incorporated herein by reference for all purposes.

FIELD OF THE INVENTION

The present disclosure relates to an electronic assembly structure, and more particularly to an inverter assembly having an elastic component for abutting against the output copper busbar and the contact terminal of the load and forming the contact therewith, so as to reduce the assembling cost of the inverter assembly sufficiently, and avoid the problem of poor contact caused by the vibration during use at the same time.

BACKGROUND OF THE INVENTION

Generally, an electronic device is often combined with a heat dissipation assembly to dissipate the internal heat. Since a high-efficiency power module used in the inverter is often accompanied with a lot of heat generated therefrom, the inverter assembly must be combined with a water-cooled heat dissipation module to achieve an effective effect of heat dissipation. Therefore, the high-power module is combined with the water-cooled heat dissipation module to form a heavy assembled structure. In use, an AC output terminal of the assembled structure of the inverter needs to be electrically connected to an AC input end of the motor.

The AC output copper busbar of the conventional inverter needs to be connected to the AC input copper busbar of the motor through the screw or the rivet. However, for being connected through the screw or the rivet, the AC output copper busbar of the inverter must be aligned with the screw holes or rivet holes on the AC input copper busbar of the motor. Therefore, it is necessary to precisely control the dimensional tolerance of the copper busbars and the assembling tolerances of the inverter and the motor. Moreover, the cost of manufacturing or assembling is also increased. On the other hand, after being assembled, the dimensional tolerances may cause the stress problems, and it may cause the structural damage of the copper busbars. Furthermore, the poor contact may be caused due to the vibration and loosening during use.

Therefore, there is a need of providing an inverter assembly having an elastic component for abutting against the output copper busbar and the contact terminal of the load and forming the contact therewith, so as to reduce the assembling cost of the inverter assembly sufficiently, avoid the problem of poor contact caused by the vibration during use, and obviate the drawbacks encountered by the prior arts.

SUMMARY OF THE INVENTION

An object of the present disclosure is to provide an inverter assembly having an elastic component for abutting against the output copper busbar and the contact terminal and forming the contact therewith, so as to reduce the assembling cost of the inverter assembly sufficiently, and avoid the problem of poor contact caused by the vibration during use. On the other hand, the elastic component is stressed to provide a restoring force, which is used to push the output copper busbar abutting against the contact terminal to achieve the electrical connection between the output copper busbar and the contact terminal. The elastic component is not directly in contact with the contact terminal. Therefore, for the design of the elastic component, there is no need to consider the electrical impedance, and it makes the structure and the material design of the elastic component less restrictive, and is also beneficial to the insulation design.

Another object of the present disclosure is to provide an inverter assembly. An output copper busbar and a contact terminal are electrically connected through the docking action to implement the DC electrical connection between the battery and the inverter or the AC electrical connection between the inverter and the load. There is no need to use the screwdriver and other tools to achieve the mutual electrical connection. Furthermore, since the output copper busbar and the contact terminal abut against each other through the modular elastic components, it facilitates to avoid the poor contact between the output copper busbar and the contact terminal due to the assembly tolerances during the docking action thereof. Since the modular elastic component has an assembling position matched to the corresponding positions of the output copper busbar and the contact terminal, and the docking action of the inverter assembly, it helps to simplify the structural design of the elastic component, reduce the assembling cost, and improve the module commonality of elastic components. Moreover, the elastic components are arranged under the output copper busbars, and the docking action between the output copper busbars and the contact terminals is not affected by the elastic components. On the other hands, it allows to arrange a pair of spacer columns on the elastic components to correspond to the output portion of the output copper busbar, so as to simplify the alignment requirements during assembling. In this way, the restoring force provided by stressing the elastic components abuts against the output portion of the output copper busbar towards the contact terminal, so as to ensure that the output portion of the output copper busbar and the contact terminals of the load are abutted against each other and maintained the contact therebetween. On the other hand, when the inverter assembly is docked with the battery or the load in using, the impact of stress due to vibration won't influence the contact between the output copper busbar and the contact terminal of the inverter assembly. The restoring force produced by the compression of the elastic components is sufficient to maintain the continuous and stable contact between the output portion of the output copper busbar and the contact terminal. Since the displacement distance of the contact terminal sliding relative to the output portion of the output copper busbar can be set when the inverter assembly is docked with the battery or the load, the restoring force generated by the output portion of the output copper busbar pushing against the elastic component can be controlled and adjusted within a specific range, so that the electrical contact between the output portion of the output copper busbar and the contact terminal is maintained stably, and the application of modular electrical connection is achieved.

In accordance with an aspect of the present disclosure, an inverter assembly is provided and includes a base, a contact terminal, an output copper busbar and an elastic component. The output copper busbar is disposed on the base, wherein the output copper busbar includes an output portion spatially corresponding to the base and configured to form an electrical connection with the contact terminal. The elastic component is disposed on the base and includes an abutting element, an elastic element and an accommodation seat, wherein the accommodation seat is disposed on the base, the abutting element is connected to the accommodation seat through the elastic element along an axial direction, the elastic element provides a restoring force when the abutting element is stressed along the axial direction, and the abutting element is spatially corresponding to the output portion, wherein when the base is docked with the contact terminal, the abutting element of the elastic component abuts against the output portion to attach to the contact terminal, and the contact terminal abuts against the abutting element and the elastic element through the output portion, so that the restoring force provided by the elastic element keeps the output portion abutting against the contact terminal.

In an embodiment, the output copper busbar is a DC output copper busbar connected to a power source, the power source is a DC power generated by a battery, and the contact terminal is connected to an inverter module, wherein when the base is docked with the contact terminal, the abutting element of the elastic component abuts against the output portion to attach to the contact terminal, and the contact terminal abuts against the abutting element and the elastic element through the output portion, so that the restoring force provided by the elastic element keeps the output portion abutting against the contact terminal, and the power source provides the inverter module with the DC power through the output copper busbar.

In an embodiment, the contact terminal is connected to an power source, the power source is a DC power generated by a battery, the output copper busbar is connected to inverter module, and the output copper busbar is a DC output copper busbar, wherein when the base is docked with the contact terminal, the abutting element of the elastic component abuts against the output portion to attach to the contact terminal, and the contact terminal abuts against the abutting element and the elastic element through the output portion, so that the restoring force provided by the elastic element keeps the output portion abutting against the contact terminal, and the power source provides the inverter module with the DC power through the output copper busbar.

In an embodiment, the contact terminal is connected to an power source, the power source is an AC power provided by an inverter module, and the output copper busbar is an AC output copper busbar and connected to a load, wherein when the base is docked with the contact terminal, the abutting element of the elastic component abuts against the output portion to attach to the contact terminal, and the contact terminal abuts against the abutting element and the elastic element through the output portion, so that the restoring force provided by the elastic element keeps the output portion abutting against the contact terminal, and the inverter module provides the load with the AC power from the power source through the output copper busbar.

In an embodiment, the output copper busbar is an AC output copper busbar connected to a power source, the power source is an AC power generated by an inverter module, and the contact terminal is connected to a load, wherein when the base is docked with the contact terminal, the abutting element of the elastic component abuts against the output portion to attach to the contact terminal, and the contact terminal abuts against the abutting element and the elastic element through the output portion, so that the restoring force provided by the elastic element keeps the output portion abutting against the contact terminal, and the inverter module provides the load with the AC power from the power source through the output copper busbar.

In an embodiment, the base includes an installation surface configured to dock with the load along a docking direction and attach to the contact terminal of the load, and the inverter module includes a power module disposed on the base and electrically connected to the output copper busbar, wherein when the base is docked with the contact terminal, the installation surface drives the elastic component and the output portion to attach to the contact terminal, the contact terminal abuts against the abutting element and the elastic element through the output portion, the abutting element is stressed along the axial direction, and the restoring force is provided by the elastic element to keeps the output portion abutting against the contact terminal, wherein when the contact terminal is not in contact with the output portion, the abutting element keeps interfering with the output portion.

In an embodiment, the elastic component includes 3N of the abutting elements, N is an integer, and $N \geq 1$.

In an embodiment, the output portion is at least partially overlapped with the abutting element and at least partially overlapped with the contact terminal in view of the docking direction.

In an embodiment, an area of the output portion is greater than an area of the abutting element, and greater than an area of the contact terminal in the view of the docking direction.

In an embodiment, the elastic component further includes a sleeve embedded in the accommodation seat, the sleeve includes a top opening, a bottom portion and a perforation, the perforation is disposed on the bottom portion and in communication with the top opening, the elastic element is accommodated in the sleeve through the top opening, and the elastic element is connected between the abutting element and the bottom portion.

In an embodiment, the abutting element is partially accommodated in the sleeve, and the elastic element is a telescopic spring accommodated in the sleeve through the top opening and connected between the abutting element and the bottom portion of the sleeve.

In an embodiment, the abutting element includes an abutting portion and a fitting portion, and an area of the abutting portion is greater than an area of the fitting portion in view of the docking direction.

In an embodiment, a top end of the fitting portion is connected to the abutting portion, a bottom end of the fitting portion passes through the perforation on the bottom portion of the sleeve, and the abutting element is allowed sliding relative to the sleeve in the docking direction and abutting against the elastic element so as to provide the restoring force.

In an embodiment, the elastic element is disposed around an outer periphery of the fitting portion and connected between the abutting portion and the bottom portion of the sleeve, the fitting portion includes an engaged slot disposed at the bottom end of the fitting portion, and the elastic component further includes an engaging ring, wherein the bottom end of the fitting portion passes through the perforation on the bottom portion of the sleeve, and the engaging ring and the engaged slot are engaged with each other, so that the abutting element is limited and not detached from the sleeve.

In an embodiment, the elastic component further includes a pair of spacer columns disposed on the accommodation seat, spatially corresponding to the output portion, and arranged on two lateral sides of the sleeve, and a height of the pair of spacer columns relative to the accommodation seat is greater than a height of the abutting element maintained at an initial position relative to the accommodation seat, so as to form a height-difference distance, wherein the height-difference distance is less than a thickness of the output portion.

In an embodiment, a first width is formed between the pair of spacer columns, the output portion has a second width), and the first width is greater than the second width.

In an embodiment, when the base is docked with the load, the contact terminal is in contact with the output portion and moved toward the installation surface by a first displacement distance, and the contact terminal abuts against the abutting element through the output portion and drives the abutting element to move toward the installation surface by a second displacement distance, wherein the first displacement distance is greater than or equal to the second displacement distance.

In an embodiment, the output portion has a thickness in view of the docking direction, and the second displacement distance is greater than or equal to the thickness.

In an embodiment, the output copper busbar is made of a soft-copper material, the accommodation seat is made of an insulation material, and the abutting element is made of a metal material, wherein a hardness of the metal material is greater than a hardness of the soft-copper material.

BRIEF DESCRIPTION OF THE DRAWINGS

The above contents of the present disclosure will become more readily apparent to those ordinarily skilled in the art after reviewing the following detailed description and accompanying drawings, in which:

FIG. 5 is a cross-section view illustrating the elastic component in the inverter assembly according to the embodiment of the present disclosure;

DETAILED DESCRIPTION OF THE PREFERRED EMBODIMENT

Figure 1:
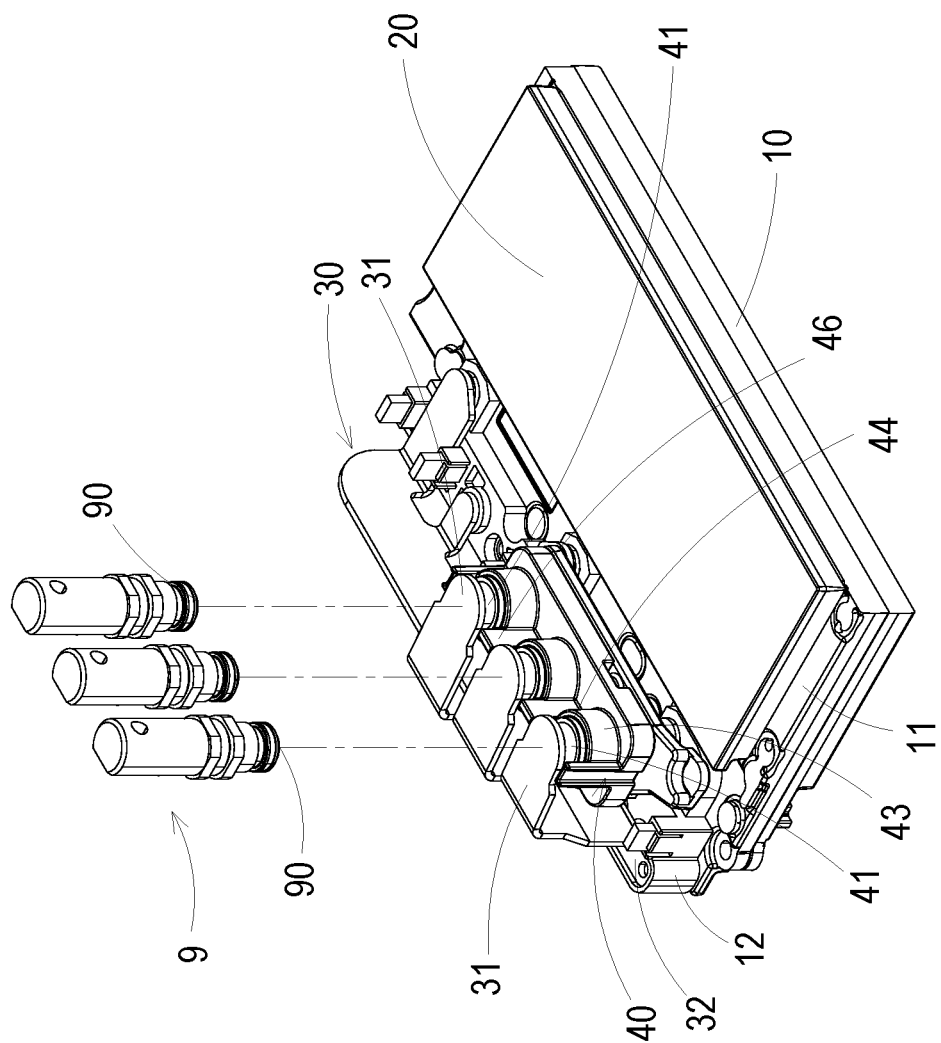
FIG. 1 is a perspective structural view illustrating an inverter assembly and a load according to an embodiment of the present disclosure.
Figure 2:
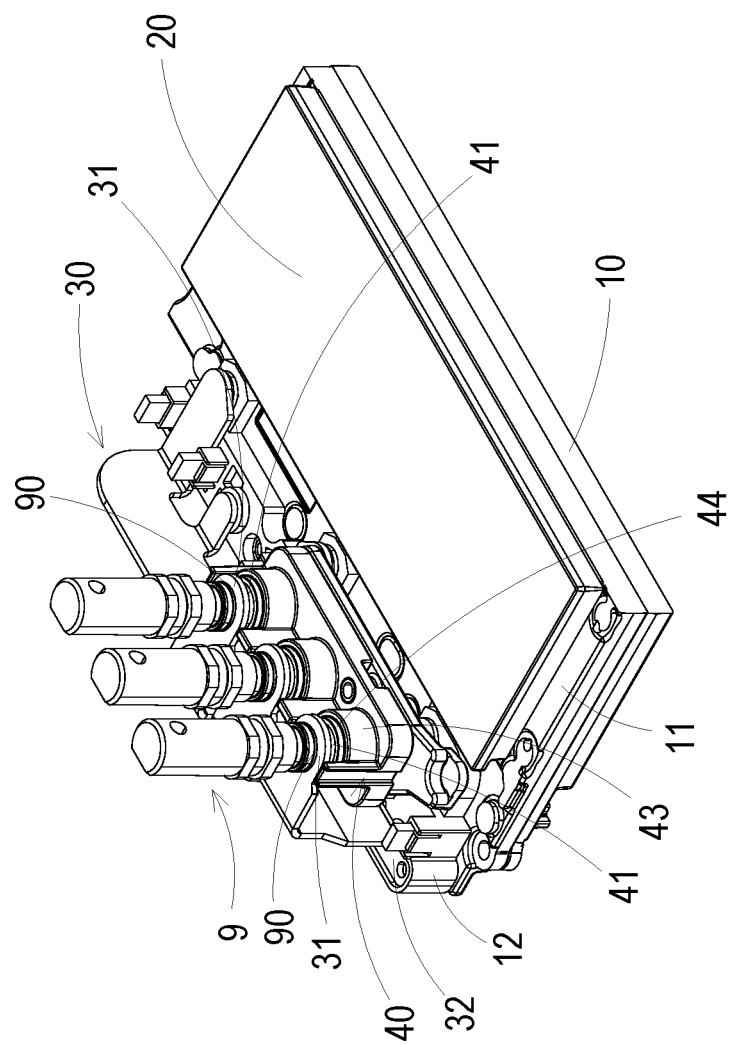
FIG. 2 is a perspective structural view illustrating the inverter assembly docked with the load according to the embodiment of the present disclosure.
Figure 3:
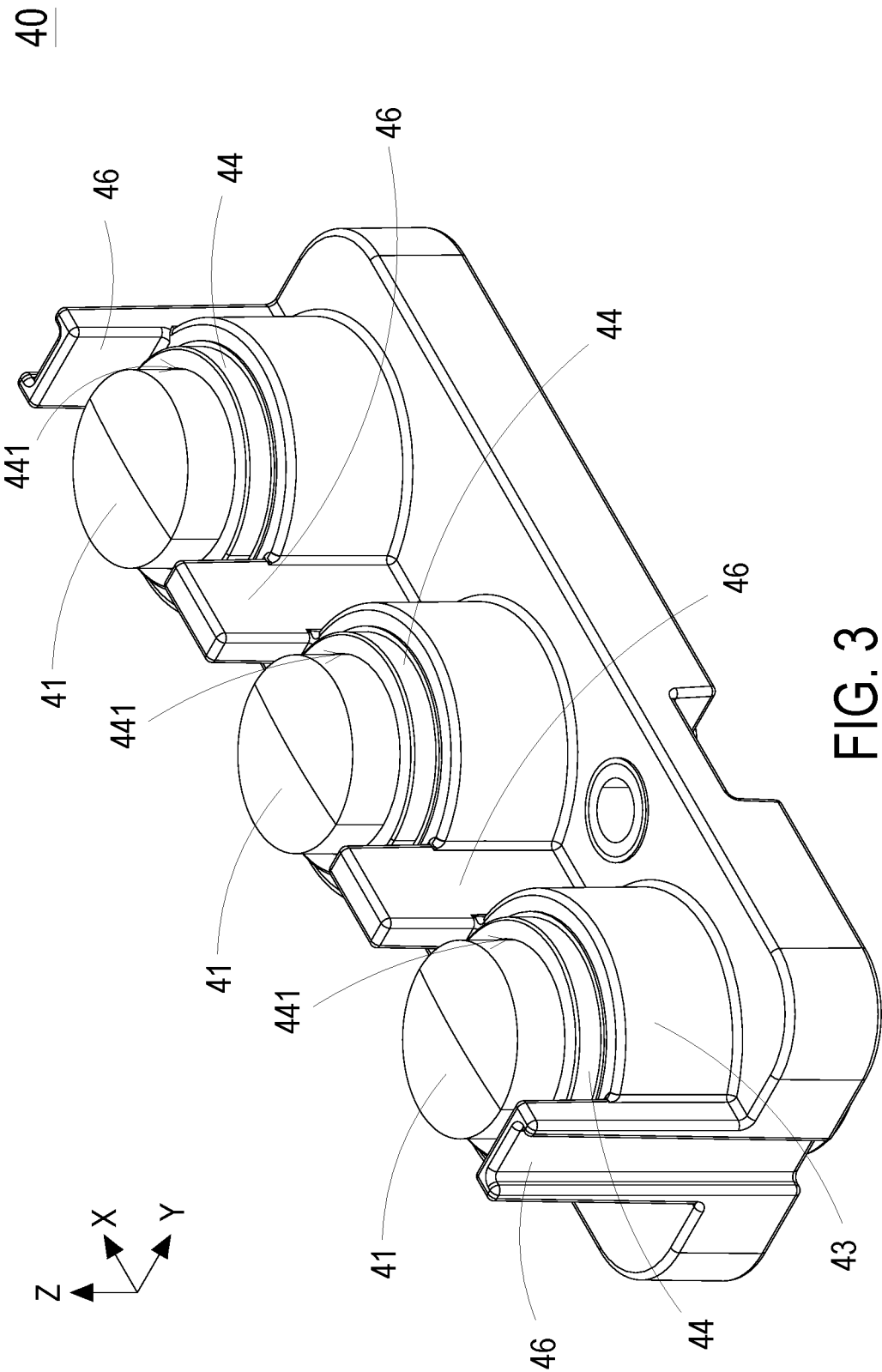
FIG. 3 is a perspective structural view illustrating the elastic component in the inverter assembly according to the embodiment of the present disclosure.
Figure 4:
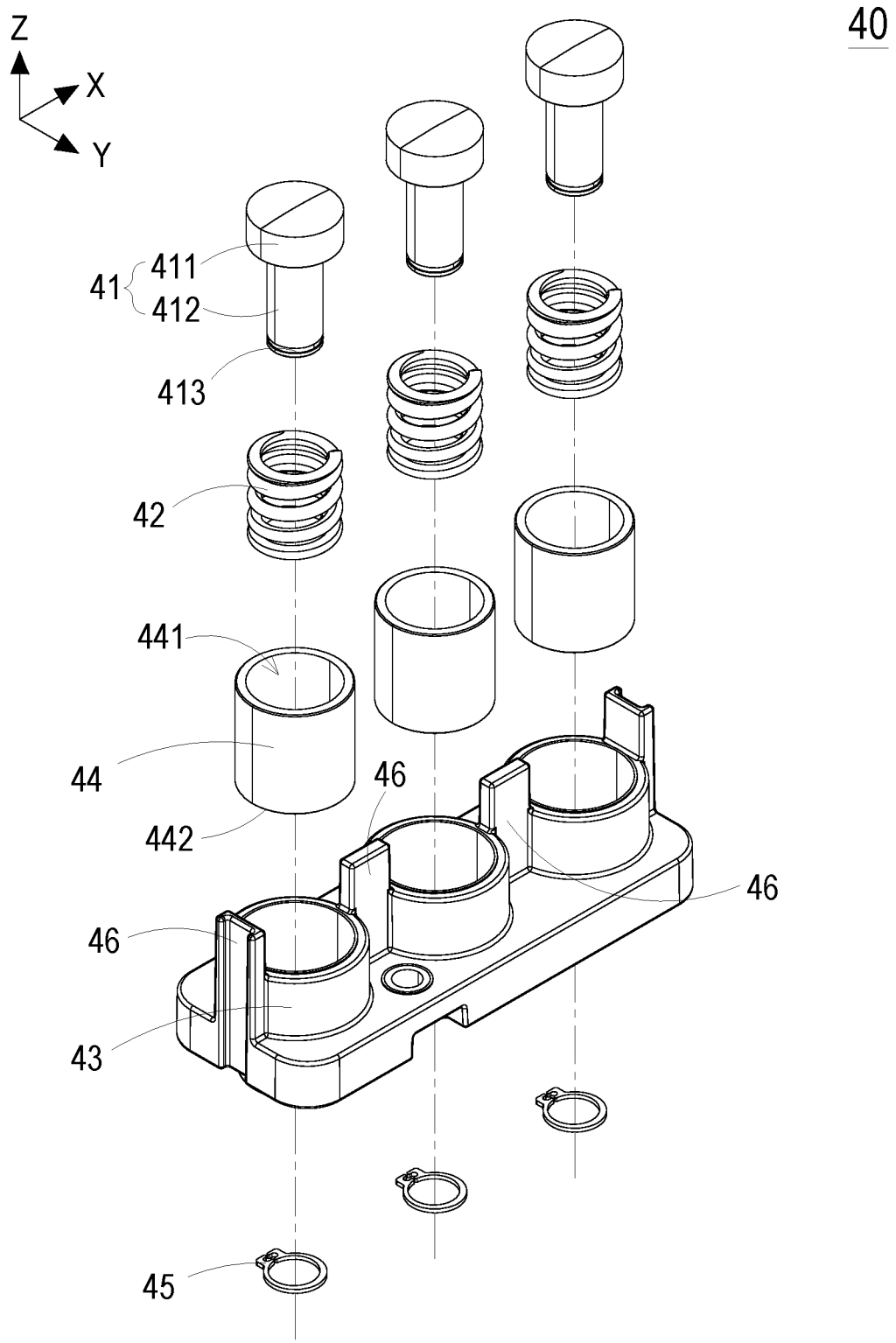
FIG. 4 is an exploded view illustrating the elastic component in the inverter assembly according to the embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "upper," "lower" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments.

Please refer to FIGS. 1 to 5. In the embodiment, the present disclosure provides an inverter assembly 1 including a base 10, a contact terminal 90, an output copper busbar 30 and an elastic component 40. The output copper busbar 30 is disposed on the base 10. In the embodiment, the output copper busbar 30 includes an output portion 31 spatially corresponding to the base 10 and configured to form an electrical connection with the contact terminal 90. The elastic component 40 is disposed on the base 10 and includes an abutting element 41, an elastic element 42 and an accommodation seat 43. In the embodiment, the accommodation seat 43 is disposed on the base 10, the abutting element 41 is connected to the accommodation seat 43 through the elastic element 42 along an axial direction. The elastic element 42 provides a restoring force when the abutting element 41 is stressed along the axial direction, and the abutting element 41 is spatially corresponding to the output portion 31. In the embodiment, when the base 10 is docked with the contact terminal 90, the abutting element 41 of the elastic component 40 abuts against the output portion 31 to attach to the contact terminal 90, and the contact terminal 90 abuts against the abutting element 41 and the elastic element 42 through the output portion 31. In this way, the restoring force provided by the elastic element 42 keeps the output portion 31 abutting against the contact terminal 90. The electrical connection between the output copper busbar 30 and the contact terminal 90 is achieved, and a power source is outputted.

Notably, the inverter assembly 1 of the present disclosure can be applied for DC output between the battery and the inverter module, or for AC output between the inverter module and a load 9. In an embodiment, the power source can be for example but not limited to a DC power source generated by a battery. The output copper busbar 30 is a DC output copper busbar and connected to the power source. The contact terminal 90 is connected to an inverter module. When the base 10 is docked with the contact terminal 90, the abutting element 41 of the elastic component 40 abuts against the output portion 31 to attach to the contact terminal 90. Furthermore, the contact terminal 90 is pushed against the abutting element 41 and the elastic element 42 through the output portion 31, and the restoring force provide by the elastic element 42 keeps the output portion 31 in contact with the contact terminal 90. In that, the DC power of the battery is served as the power source, and the DC power is supplied to the inverter module through the output copper busbar 30. In another embodiment, the contact terminal 90 is connected to an inverter module, and the output copper busbar 30 is connected to the power source. When the base 10 is docked with the contact terminal 90, the abutting element 41 of the elastic component 40 abuts against the output portion 31 to attach to the contact terminal 90, and the contact terminal 90 is pushed against the abutting element 41 and the elastic element 42 through the output portion 31. The restoring force provided by the elastic element 42 keeps the output portion 31 in contact with the contact terminal 90. In that, the DC power of the battery is served as the power source, and the DC power is supplied to the inverter module through the output copper busbar 30. Furthermore, in an embodiment, the contact terminal 90 is connected to the power source, and the power source is an AC power provided by the inverter module. The output copper busbar 30 is an AC output copper busbar and connected to a load. When the base 10 and the contact terminal 90 are docked with each other, the abutting element 41 of the elastic component 40 abuts against the output portion 31 to attach to the contact terminal 90, and the contact terminal 90 pushes against the abutting element 41 and the elastic element 42 through the output portion 31. The restoring force provided by the elastic element 42 keeps the output portion 31 in contact with the contact terminal 90. In that, the AC power provided by the inverter module is served as the power source, and the AC power is supplied to the load through the output copper busbar 30. In another embodiment, the output copper busbar 30 is an AC output copper busbar and connected to an AC power source, which is provided by an inverter module and served as a power source. The contact terminal 90 is connected to the load 9. When the base 10 is docked with the contact terminal 90, the abutting element 41 of the elastic component 4 abuts against the output portion 31 to attach to the contact terminal 90, and the contact terminal 90 pushes against the abutting element 41 and the elastic element 42 through the output portion 31. The restoring force provided by the elastic element 42 keeps the output portion 31 in contact with the contact terminal 90. In that, the AC power provided by the inverter module is served as the power source, and the AC power is supplied to the load through the output copper busbar 30. In other words, the power source can be for example but not limited to an AC power or a DC power, which is connected to the output copper busbar 30 and then transmitted to the contact terminal 90. Moreover, the AC power or the DC power transmitted to the contact terminal 90 can be used by the load or the inverter module. On the contrary, the power source can be connected to the contact terminal 90. The AC power or the DC power is transmitted to the output copper busbar 30. Thereafter, the output copper busbar 30 outputs the AC power or the DC power to the load or the inverter module for use. The combination of the inverter module connected to the output copper busbar 30 and the load 9 connected to the contact terminal 90 for the AC power output is used in the following descriptions for illustration. The present disclosure is not limited thereto.

In the embodiment, the base 10 includes an installation surface 11, for example the upper surface of the base 10, configured to dock with the load 9 along a docking direction, such as the Z axial direction. When the base 10 is docked with the load 9, the installation surface 11 is attached to the contact terminal 90 of the load 9. In the embodiment, the inverter module includes a power module 20 disposed on the installation surface 11 of the base 10. Preferably but not exclusively, the power module 20 is stacked on the upper surface and the lower surface of the base. The present disclosure is not limited thereto. Preferably but not exclusively, in the embodiment, the output copper busbar 30 is an AC output copper busbar including a connection portion 32 and electrically connected to the power module 20. Certainly, the manner of disposing the output copper busbar 30 on the base or the electrical connection between the output copper busbar 30 and the power module 20 is adjustable according to the practical requirements, and not limited thereto in the present disclosure. Notably, in the embodiment, the output copper busbar 30 includes the output portion 31 spatially corresponding to the installation surface 11. Furthermore, when the base 10 is docked with the load 9, the output portion 31 of the output copper busbar 30 and the contact terminal 90 of the load 9 are electrically connected with each other through the action of the elastic component 40. In the embodiment, the elastic component 40 is disposed on the installation surface 11 of the base 10, and includes the abutting element 41, the elastic element 42 and the accommodation seat 43. Preferably but not exclusively, in the embodiment, the accommodation seat 43 is made of an insulation material and arranged on the installation surface 11 of the base 10. The abutting element 41 is connected to the accommodation seat 43 through the elastic element 42. Moreover, a restoring force is provided by the elastic element 42 when the abutting element 41 is forced toward the installation surface 11 in the axial direction. When the contact terminal 90 is not in contact with the output portion 31, the abutting element 41 keeps interfering with the output portion 31. Certainly, the present disclosure is not limited thereto. In the embodiment, the abutting element 41 is spatially corresponding to the output portion 31 of the output copper busbar 30. When the base 10 is docked with the contact terminal 90, the installation surface drives the elastic component 40 and the output portion 31 of the output copper busbar 30 to attach to the contact terminal 90, and the contact terminal 90 abuts against the abutting element 41 and the elastic element 42 downwardly through the output portion 31. In that, the abutting element 41 is stressed along the axial direction, and the restoring force is provided by the elastic element 42 to keeps the output portion 31 of the output copper busbar 30 abutting against the contact terminal 90 of the load 9. In this way, the output copper busbar 30 of the inverter assembly 1 and the contact terminal 90 of the load 9 are electrically connected with each other through the docking action of the inverter assembly 1 and the load 9. There is no need to use the screwdriver and other tools to achieve the mutual electrical connection between the output copper busbar 30 of the inverter assembly 1 and the contact terminal 90 of the load 9. In other words, the electrical connection between the output portion 31 of the output copper busbar 30 and the load 9 is achieved by utilizing the abutment of the elastic component 40, so as to reduce the assembling cost of the inverter assembly 1 and the load 9 sufficiently, and avoid the problem of poor contact caused by the vibration during use at the same time.

Notably, in the embodiment, the numbers of corresponding structures of the contact terminal 90 of the load 9, the output portion 31 of the output copper busbar 30 and the elastic component 40 are three as an example for illustrating that the inverter assembly 1 has a three-phase AC output, and the present disclosure is not limited thereto. Preferably but not exclusively, in the embodiment, the elastic component 40 includes 3N abutting elements 41, N is an integer, and N≥1, so that the elastic component 40 is allowed to correspond to one single-phase output application or a multi-phase output application. In other embodiments, the numbers of corresponding structures of the power module 20, the contact terminal 90 of the load 9, the output portion 31 of the output copper busbar 30 and the elastic component 40 are adjustable according to the practical requirements, and the present disclosure is not limited thereto. On the other hand, in the embodiment, the output copper busbar 30 is made of a soft-copper material, and the abutting element 41 is made of a metal material. A hardness of the metal material is greater than a hardness of the soft-copper material. In this way, when the inverter assembly 1 is docked with the load 9, the restoring force provided by the elastic component 40 through the abutting element 41 can fully act on the output portion 31, and make the output portion 31 more tightly abutted against the abutting element 41. In addition, the accommodation seat 43 is made of an insulation material. When the abutting element 41 is connected to the accommodation seat 43 through the elastic element 42, the electrical connection of the output copper busbar 30 or other circuits is not affected the accommodation seat 43. Notably, the elastic component 40 is stressed to provide the restoring force, and further used to push the output copper busbar 30 against the contact terminal 90 to achieve the electrical connection between the output copper busbar 30 and the contact terminal 90. The abutting element 41, the elastic element and the accommodation seat 43 of the elastic component 40 is not directly in contact with the contact terminal 90. Therefore, for the design of the elastic component 40, there is no need to consider the electrical impedance, and it makes the structure and the material design of the elastic component 40 less restrictive, and is also beneficial to the insulation design. Certainly, the present disclosure is not limited thereto.

In the embodiment, the output portion 31 of the output copper busbar 30 is at least partially overlapped with the abutting element 41 of the elastic component 40 in view of the docking direction (i.e., the Z axial direction). Moreover, when the base 10 is docked with the load 9, the output portion 31, the abutting element 41 and the contact terminal 90 are at least partially overlapped with each other. In this way, the contact terminal 90 is driven to push against the lower abutting element 41 and the elastic element 42 through the output portion during the docking action of the inverter assembly 1 and the load 9. Certainly, in view of the docking direction (i.e., the Z axial direction), the larger the overlapping area of the output portion 31, the abutting element 41 and the contact terminal 90, the more favorable it is to actuate the operation through the docking action, and reduce the impact of poor contact due to the assembly tolerances at the same time. Furthermore, an area of the output portion 31 is greater than an area of the abutting element 41, and greater than an area of the contact terminal 90 in the view of the docking direction (i.e., the Z axial direction), and it also facilitates the restoring force of the elastic element 42 to act on the output portion 31, and avoids the poor contact between the output portion 31 and the contact terminal 90 caused by the assembly tolerances during docking the inverter assembly 1 and the load 9. Certainly, the present disclosure is not limited thereto.

In the embodiment, the elastic component 40 further includes a sleeve 44 embedded in the accommodation seat 43. Preferably but not exclusively, the sleeve 44 is a cylindrical sleeve. The sleeve 44 includes a top opening 441, a bottom portion 442 and a perforation 443. The perforation 443 is disposed on the bottom portion 442 and in communication with the top opening 441. Preferably but not exclusively, the elastic element 42 is a telescopic spring and accommodated in the sleeve 44 through the top opening 441. Moreover, the elastic element 42 is connected between the abutting element 41 and the bottom portion 442 of the sleeve 44. In the embodiment, the abutting element 41 is partially accommodated in the sleeve 44 and includes an abutting portion 411 and a fitting portion 412. Preferably but not exclusively, an area of the abutting portion 411 is greater than an area of the fitting portion 412 in the view of the docking direction (i.e., the Z axial direction). That is, the diameter of the abutting portion 411 is greater than the diameter of the fitting portion 412. Preferably but not exclusively, the size of the fitting portion 412 is fit with the perforation 443 of the sleeve 44. In the embodiment, a top end of the fitting portion 412 is connected to the abutting portion 411, and a bottom end of the fitting portion 412 passes through the perforation 443 on the bottom portion 442 of the sleeve 44. Moreover, the abutting element 41 is allowed sliding relative to the sleeve 44 in the docking direction and abutting against the elastic element 42 so as to provide the restoring force. Preferably but not exclusively, in the embodiment, the elastic element 42 is a telescopic spring disposed around an outer periphery of the fitting portion 412 and connected between the abutting portion 411 and the bottom portion 442 of the sleeve 44. In addition, the fitting portion 412 includes an engaged slot 413 disposed at the bottom end of the fitting portion 412, and the elastic component 40 further includes an engaging ring 45. In the embodiment, for disposing the abutting element 41 and the elastic element 42 on the sleeve 44, the elastic element 42 is preset in the sleeve 44, the bottom end of the fitting portion 412 passes through the elastic element 42 and the perforation 443 on the bottom portion 442 of the sleeve 44, and the engaging ring 45 and the engaged slot 413 are engaged with each other, so that the abutting element 41 is limited and not detached from the sleeve 44. At the same time, the restoring force provided by the elastic element 42 acts between the abutting element 41 and the sleeve 44. Since the modular elastic component 40 has an assembling position matched to the corresponding positions of the output portion 31 of the output copper busbar 30 and the contact terminal 90 of the load 9, and the docking action of the inverter assembly 1 and the load 9, it helps to simplify the structural design of the elastic component 40, reduce the assembling cost, and improve the module commonality of elastic component 40. Certainly, the present disclosure is not limited thereto.

Figure 6A:
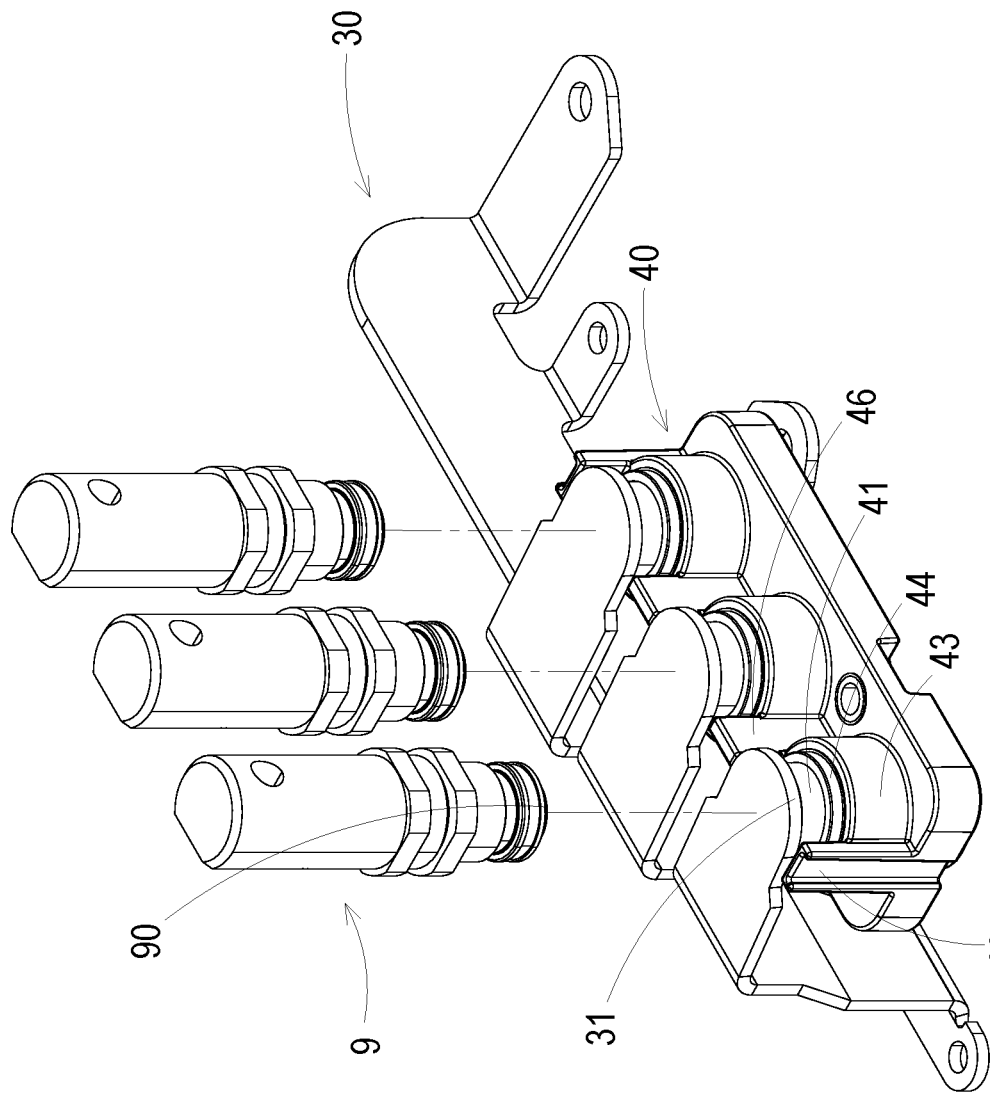
FIGS. 6A to 6C are perspective structural views show the docking action between the output copper busbar and the elastic component of the inverter assembly and the load according to the embodiment of the present disclosure.
Figure 6B:
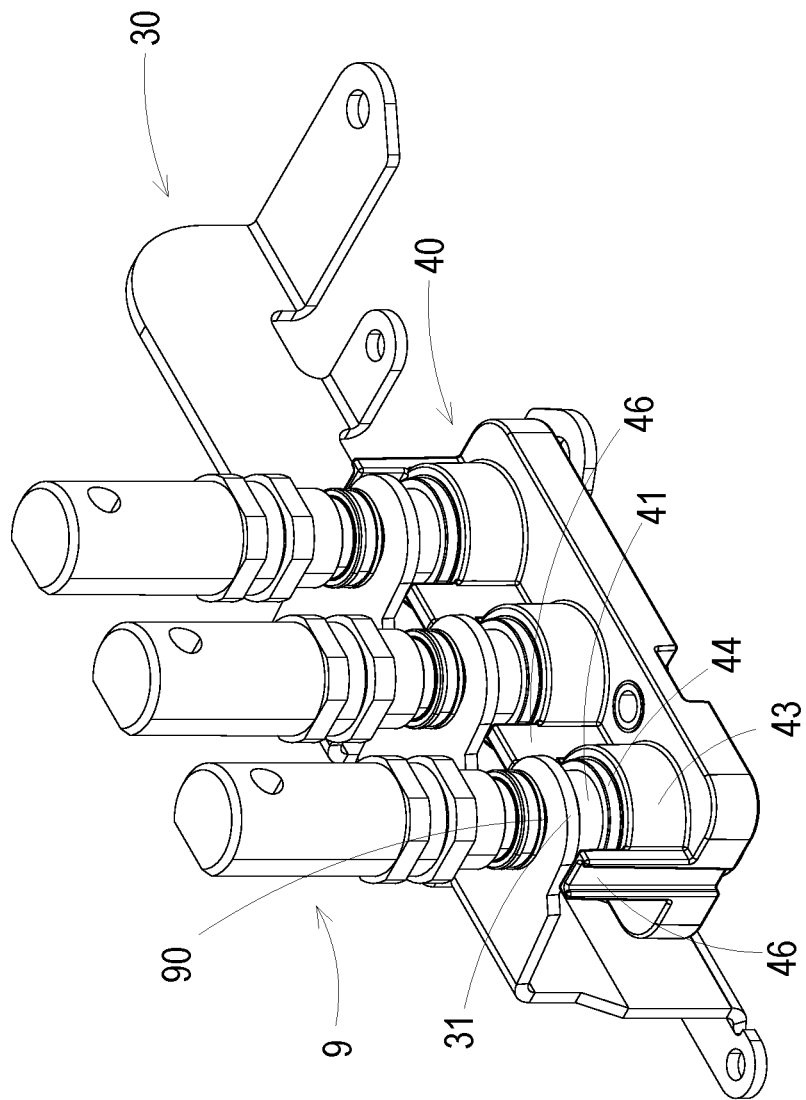
Figure 6C:
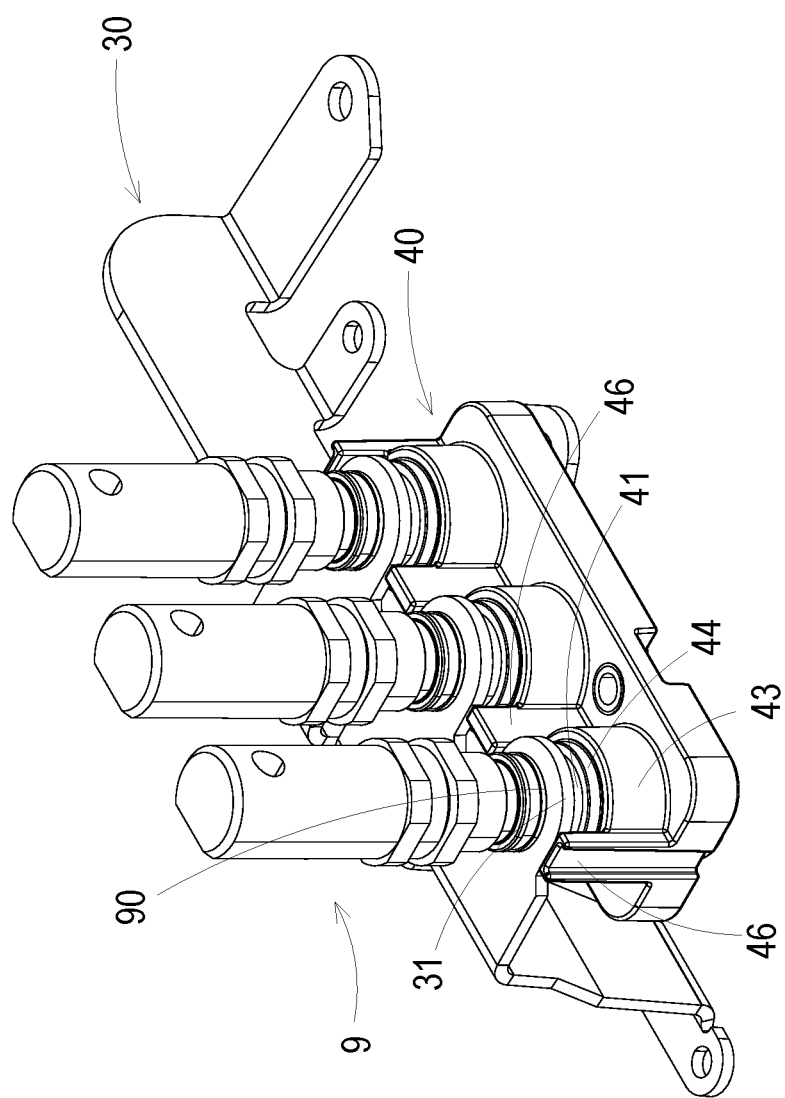
Figure 7A:
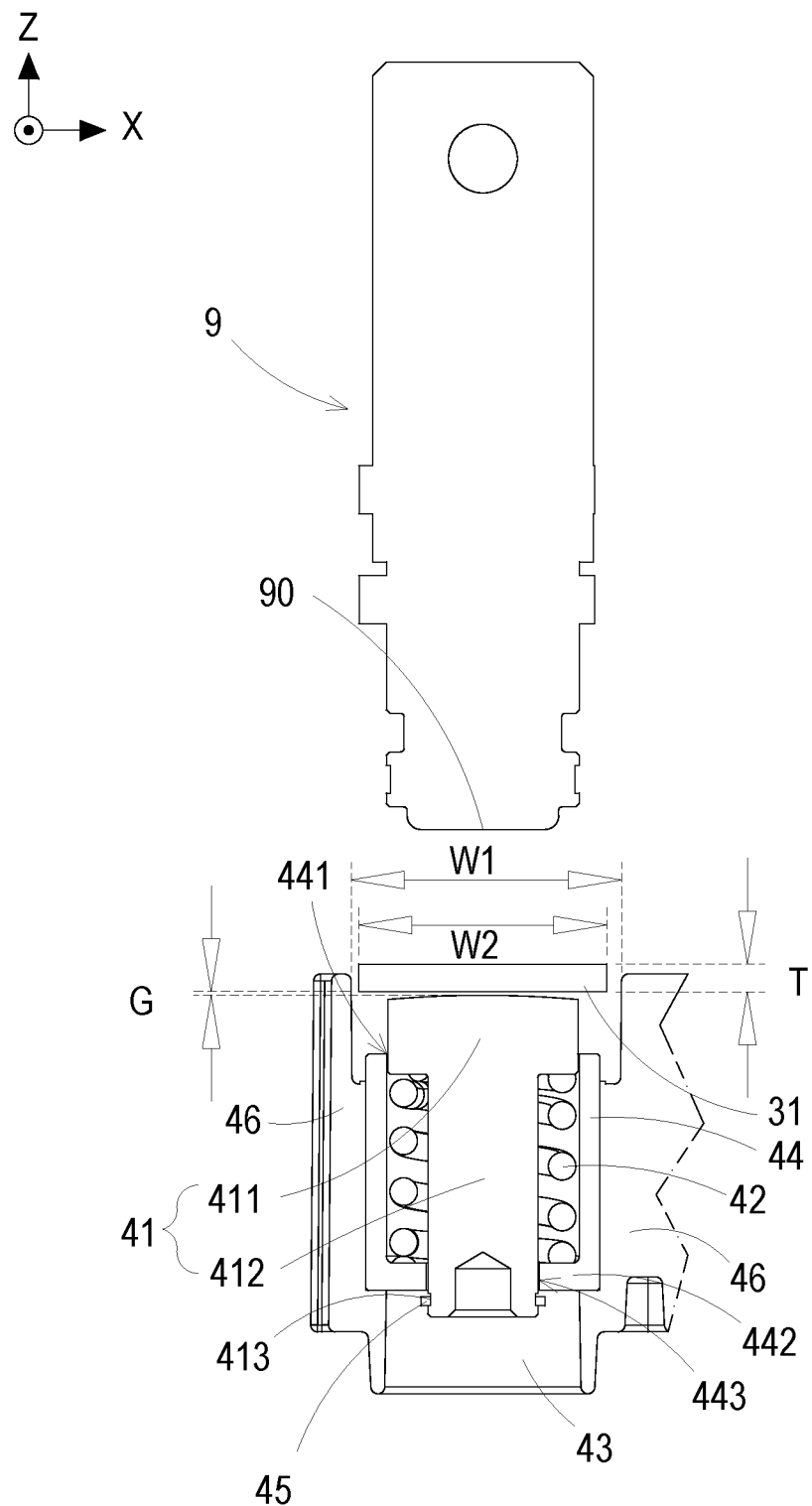
FIGS. 7A to 7C are cross-section views show the relationship among the contact terminal, the output portion and the elastic component when the inverter assembly is docked with the load according to the embodiment of the present disclosure.
Figure 7B:
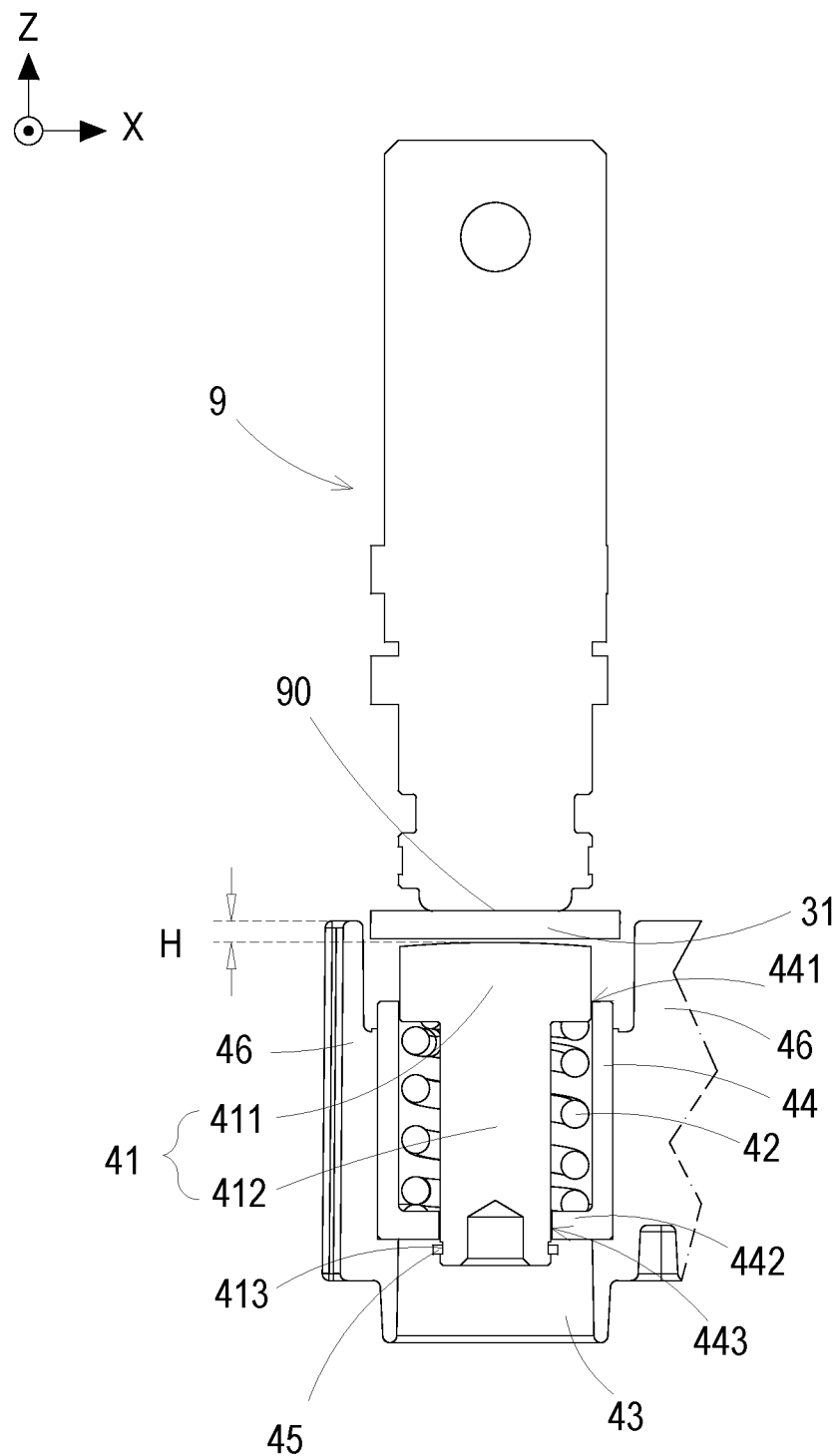
Figure 7C:
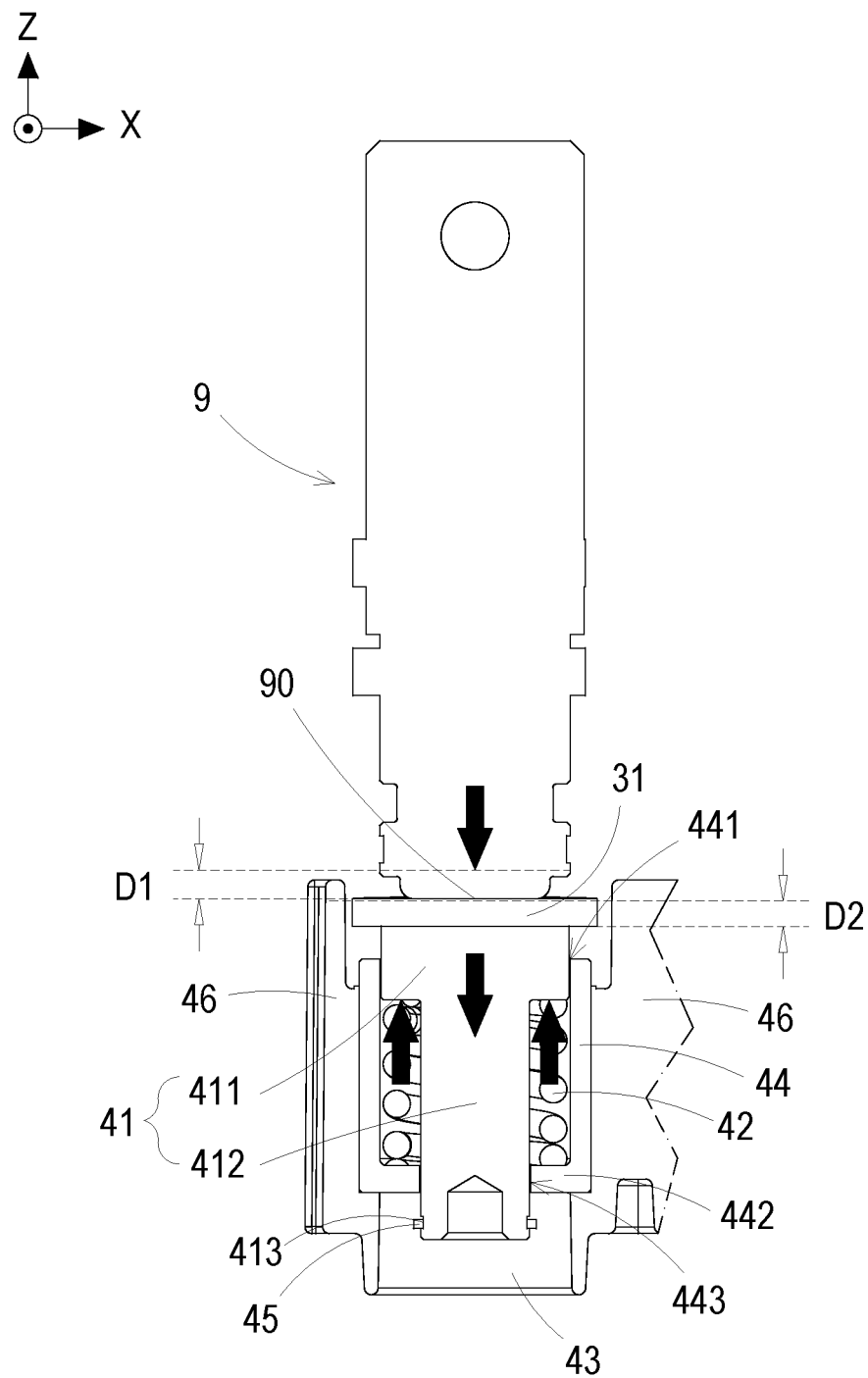

Please refer to FIG. 1, FIG. 6A to FIG. 6C and FIG. 7A to FIG. 7C. In the embodiment, the inverter assembly 1 is configured to dock with the load 9, so as to provide a three-phase AC output current to the load 9. The output current needs to be implemented through the electrical connection between the contact terminal 90 and the output portion 31 of the output copper busbar 30. Therefore, the output portion 31 and the contact terminal 90 face each other in the docking direction (i.e., the Z axial direction), as shown in FIGS. 6A and 7A. In the embodiment, the electrical connection between the output portion 31 and the contact terminal 90 are implemented through the elastic component 40 below the output portion 31. When the inverter assembly 1 and the load 9 are docked with each other, the contact terminal 90 of the load 9 is in contact with the output portion 31 firstly, as shown in FIG. 6B and FIG. 7B. At this time, the abutting element 41 of the elastic component 40 is located at an initial position, and a gap distance G is formed for example by the assembly tolerance and maintained between the abutting element 41 and the output portion 31. Preferably but not exclusively, in other embodiments, the gap distance G is zero. That is, when the contact terminal 90 of the load 9 is not in contact with the output portion 31, the abutting element 41 keeps interfering with the output portion 31. Certainly, the present disclosure is not limited thereto. After the inverter assembly 1 and the load 9 are docked and assembled, the contact terminal 90 of the load 9 is in contact with the output portion 31 and moved toward the installation surface 11 (i.e., in the inverse Z axial direction) by a first displacement distance D1. At the same time, the contact terminal 90 abuts against the lower abutting element 41 through the output portion 31 and drives the abutting element 41 to move toward the installation surface 11 (i.e., in the inverse Z axial direction) by a second displacement distance D2. Preferably but not exclusively, the first displacement distance D1 is greater than or equal to the second displacement distance D2. In the embodiment, the difference between the first displacement distance D1 and the second displacement distance D2 is the aforementioned gap distance G, which is adjustable according the practical requirements. Furthermore, in the embodiment, the output portion 31 has a thickness T in the view of the docking direction. Preferably but not exclusively, in the embodiment, the second displacement distance D2 is greater than or equal to the thickness T. Notably, the restoring force provided by the elastic element 42 is related to the displacement distance of the abutting element 41. The magnitude of the restoring force provided by the elastic element 42 is adjustable by controlling the displacement distance of the abutting element 41 in the docking direction. In other words, through the size design of the first displacement distance D1, the second displacement distance D2 and the thickness T, it ensures that the contact terminal 90 drives the output portion 31 and the abutting element 41 of the present disclosure to press down the elastic element 42 and generate the sufficient and stable restoring force. The output portion 31 is clamped firmly between the contact terminal 90 and the abutting element 41, and the electrical connection between the contact terminal 90 and the output portion 31 is maintained. On the other hand, the restoring force provided by the elastic component 40 acts only in the docking direction, and the abutment formed by the contact terminal 90 and the output portion 31 does not produce any fastened stress in other horizontal directions. The problem of poor contact between the inverter assembly 1 and the load 9 caused by the vibration during use is avoided. Certainly, the present disclosure is not limited thereto.

In the embodiment, the elastic component 40 further includes a pair of spacer columns 46 disposed on the accommodation seat 43, spatially corresponding to the output portion 31, and arranged on two lateral sides of the sleeve 44. A height of the pair of spacer columns 46 relative to the accommodation seat 43 is greater than a height of the abutting element 41 maintained at an initial position relative to the accommodation seat 43, so as to form a height-difference distance H, as show in FIG. 7B. Preferably but not exclusively, the space distance H is less than a thickness T of the output portion 31, so as to facilitate the alignment and assembly of the output portion 31 and the elastic component 40. Moreover, in the embodiment, a first width W1 is formed between the pair of spacer columns 46, the output portion 31 has a second width W2, and the first width W1 is greater than the second width W2 so as to further simplify the alignment and assembly of the output portion 31 and the elastic component 40. Certainly, the present disclosure is not limited thereto.

From the above, by utilizing the restoring force provided by the elastic component 40 to push against the output portion 31 of the output copper busbar 30 and form the abutment with the contact terminal 90 of the load 9, it facilitates to reduce the assembling cost and the assembly tolerances of the inverter assembly 1 and the load 9 sufficiently, and avoid the problem of poor contact caused by the vibration during use. Notably, the abutting force of the output portion 31 of the output copper busbar 30 corresponding to the contact terminal 90 of the load 9 to form an electrical connection is implemented by changing the size design of the elastic component 40. The various combinations of the aforementioned features are adjustable according to the practical requirements. The present disclosure is not limited thereto.

In summary, the present disclosure provides an inverter assembly. The inverter assembly includes an elastic component for abutting against the output copper busbar and the contact terminal and forming the contact therewith, so as to reduce the assembling cost the assembly tolerances of the inverter assembly sufficiently, and avoid the problem of poor contact caused by the vibration during use. On the other hand, the elastic component is stressed to provide a restoring force, which is used to push the output copper busbar abutting against the contact terminal to achieve the electrical connection between the output copper busbar and the contact terminal. The elastic component is not directly in contact with the contact terminal. Therefore, for the design of the elastic component, there is no need to consider the electrical impedance, and it makes the structure and the material design of the elastic component less restrictive, and is also beneficial to the insulation design. In addition, an output copper busbar and a contact terminal are electrically connected through the docking action to implement the DC electrical connection between the battery and the inverter or the AC electrical connection between the inverter and the load. There is no need to use the screwdriver and other tools to achieve the mutual electrical connection. Furthermore, since the output copper busbar and the contact terminal abut against each other through the modular elastic components, it facilitates to avoid the poor contact between the output copper busbar and the contact terminal due to the assembly tolerances during the docking action thereof. Since the modular elastic component has an assembling position matched to the corresponding positions of the output copper busbar and the contact terminal, and the docking action of the inverter assembly, it helps to simplify the structural design of the elastic component, reduce the assembling cost, and improve the module commonality of elastic components. Moreover, the elastic components are arranged under the output copper busbars, and the docking action between the output copper busbars and the contact terminals is not affected by the elastic components. On the other hands, it allows to arrange a pair of spacer columns on the elastic components to correspond to the output portion of the output copper busbar, so as to simplify the alignment requirements during assembling. In this way, the restoring force provided by stressing the elastic components abuts against the output portion of the output copper busbar towards the contact terminal, so as to ensure that the output portion of the output copper busbar and the contact terminals of the load are abutted against each other and maintained the contact therebetween. On the other hand, when the inverter assembly is docked with the battery or the load in using, the impact of stress due to vibration won't influence the contact between the output copper busbar and the contact terminal of the inverter assembly. The restoring force produced by the compression of the elastic components is sufficient to maintain the continuous and stable contact between the output portion of the output copper busbar and the contact terminal. Since the displacement distance of the contact terminal sliding relative to the output portion of the output copper busbar can be set when the inverter assembly is docked with the battery or the load, the restoring force generated by the output portion of the output copper busbar pushing against the elastic component can be controlled and adjusted within a specific range, so that the electrical contact between the output portion of the output copper busbar and the contact terminal is maintained stably, and the application of modular electrical connection is achieved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An inverter assembly comprising:
   a base;
   a contact terminal;
   an output copper busbar disposed on the base, wherein the output copper busbar comprises an output portion spatially corresponding to the base and configured to form an electrical connection with the contact terminal; and
   an elastic component disposed on the base and comprising an abutting element, an elastic element and an accommodation seat, wherein the accommodation seat is disposed on the base, the abutting element is connected to the accommodation seat through the elastic element along an axial direction, the elastic element provides a restoring force when the abutting element is stressed along the axial direction, and the abutting element is spatially corresponding to the output portion, wherein when the base is docked with the contact terminal, the a butting element of the elastic component abuts against the output portion to attach to the contact terminal, and the contact terminal abuts against the abutting element and the elastic element through the output portion, so that the restoring force provided by the elastic element keeps the output portion abutting against the contact terminal, wherein the elastic component further comprises a sleeve embedded in the accommodation seat and a pair of spacer columns, wherein the pair of spacer columns are disposed on the accommodation seat, spatially corresponding to the output portion, and arranged on two lateral sides of the sleeve, and a height of the pair of spacer columns relative to the accommodation seat is greater than a height of the abutting element maintained at an initial position relative to the accommodation seat, so as to form a height-difference distance, wherein the height-difference distance is less than a thickness of the output portion.

2. The inverter assembly according to claim 1, wherein the output copper busbar is a DC output copper busbar connected to a power source, the power source is a DC power generated by a battery, and the contact terminal is connected to an inverter module, wherein when the base is docked with the contact terminal, the abutting element of the elastic component abuts against the output portion to attach to the contact terminal, and the contact terminal abuts against the abutting element and the elastic element through the output portion, so that the restoring force provided by the elastic element keeps the output portion abutting against the contact terminal, and the power source provides the inverter module with the DC power through the output copper busbar.

3. The inverter assembly according to claim 1, wherein the contact terminal is connected to an power source, the power source is a DC power generated by a battery, the output copper busbar is connected to inverter module, and the output copper busbar is a DC output copper busbar, wherein when the base is docked with the contact terminal, the abutting element of the elastic component abuts against the output portion to attach to the contact terminal, and the contact terminal abuts against the abutting element and the elastic element through the output portion, so that the restoring force provided by the elastic element keeps the output portion abutting against the contact terminal, and the power source provides the inverter module with the DC power through the output copper busbar.

4. The inverter assembly according to claim 1, wherein the contact terminal is connected to an power source, the power source is an AC power provided by an inverter module, and the output copper busbar is an AC output copper busbar and connected to a load, wherein when the base is docked with the contact terminal, the abutting element of the elastic component abuts against the output portion to attach to the contact terminal, and the contact terminal abuts against the abutting element and the elastic element through the output portion, so that the restoring force provided by the elastic element keeps the output portion abutting against the contact terminal, and the inverter module provides the load with the AC power from the power source through the output copper busbar.

5. The inverter assembly according to claim 1, wherein the output copper busbar is an AC output copper busbar connected to a power source, the power source is an AC power generated by an inverter module, and the contact terminal is connected to a load, wherein when the base is docked with the contact terminal, the abutting element of the elastic component abuts against the output portion to attach to the contact terminal, and the contact terminal abuts against the abutting element and the elastic element through the output portion, so that the restoring force provided by the elastic element keeps the output portion abutting against the contact terminal, and the inverter module provides the load with the AC power from the power source through the output copper busbar.

6. The inverter assembly according to claim 5, wherein the base comprises an installation surface configured to dock with the load along a docking direction and attach to the contact terminal of the load, and the inverter module comprises a power module disposed on the base and electrically connected to the output copper busbar, wherein when the base is docked with the contact terminal, the installation surface drives the elastic component and the output portion to attach to the contact terminal, the contact terminal abuts against the abutting element and the elastic element through the output portion, the abutting element is stressed along the axial direction, and the restoring force is provided by the elastic element to keeps the output portion abutting against the contact terminal, wherein when the contact terminal is not in contact with the output portion, the abutting element keeps interfering with the output portion.

7. The inverter assembly according to claim 6, wherein the elastic component comprises 3N of the abutting element, N is an integer, and N≥1.

8. The inverter assembly according to claim 6, wherein the output portion is at least partially overlapped with the abutting element and at least partially overlapped with the contact terminal in view of the docking direction.

9. The inverter assembly according to claim 6, wherein an area of the output portion is greater than an area of the abutting element, and greater than an area of the contact terminal in the view of the docking direction.

10. The inverter assembly according to claim 6, wherein the sleeve comprises a top opening, a bottom portion and a perforation, the perforation is disposed on the bottom portion and in communication with the top opening, the elastic element is accommodated in the sleeve through the top opening, and the elastic element is connected between the abutting element and the bottom portion.

11. The inverter assembly according to claim 10, wherein the abutting element is partially accommodated in the sleeve, and the elastic element is a telescopic spring accommodated in the sleeve through the top opening and connected between the abutting element and the bottom portion of the sleeve.

12. The inverter assembly according to claim 10, wherein the abutting element comprises an abutting portion and a fitting portion, and an area of the abutting portion is greater than an area of the fitting portion in view of the docking direction.

13. The inverter assembly according to claim 12, wherein a top end of the fitting portion is connected to the abutting portion, a bottom end of the fitting portion passes through the perforation on the bottom portion of the sleeve, and the abutting element is allowed sliding relative to the sleeve in the docking direction and abutting against the elastic element so as to provide the restoring force.

14. The inverter assembly according to claim 13, wherein the elastic element is disposed around an outer periphery of the fitting portion and connected between the abutting portion and the bottom portion of the sleeve, the fitting portion comprises an engaged slot disposed at the bottom end of the fitting portion, and the elastic component further comprises an engaging ring, wherein the bottom end of the fitting portion passes through the perforation on the bottom portion of the sleeve, and the engaging ring and the engaged slot are engaged with each other, so that the abutting element is limited and not detached from the sleeve.

15. The inverter assembly according to claim 6, wherein when the base is docked with the load, the contact terminal is in contact with the output portion and moved toward the installation surface by a first displacement distance, and the contact terminal abuts against the abutting element through the output portion and drives the abutting element to move toward the installation surface by a second displacement distance, wherein the first displacement distance is greater than or equal to the second displacement distance.

16. The inverter assembly according to claim 15, wherein the output portion has a thickness in view of the docking direction, and the second displacement distance is greater than or equal to the thickness.

17. The inverter assembly according to claim 1, wherein a first width is formed between the pair of spacer columns, the output portion has a second width, and the first width is greater than the second width.

18. The inverter assembly according to claim 1, wherein the output copper busbar is made of a soft-copper material, the accommodation seat is made of an insulation material, and the abutting element is made of a metal material, wherein a hardness of the metal material is greater than a hardness of the soft-copper material.

* * * * *